United States Patent [19]
Horie et al.

[11] Patent Number: 5,708,378
[45] Date of Patent: Jan. 13, 1998

[54] FREQUENCY-TO-VOLTAGE CONVERTING APPARATUS

[75] Inventors: Masakiyo Horie, Toyohashi; Takuya Harada, Okazaki, both of Japan

[73] Assignee: Nippondenso Co., Ltd., Aichi-pref, Japan

[21] Appl. No.: 455,895

[22] Filed: May 31, 1995

[30] Foreign Application Priority Data

May 31, 1994 [JP] Japan ................................. 6-117822
Apr. 20, 1995 [JP] Japan ................................. 7-095218

[51] Int. Cl.[6] ................................................. H03K 9/06
[52] U.S. Cl. ............................... 327/102; 327/23; 327/24
[58] Field of Search ............................. 327/100, 22, 23, 327/24, 102, 306, 309, 199, 18, 141, 40, 41

[56] References Cited

U.S. PATENT DOCUMENTS

| 3,778,638 | 12/1973 | Garratt | 327/102 |
| 4,446,439 | 5/1984 | Mizumoto et al. | 327/102 |

FOREIGN PATENT DOCUMENTS 49-135656 12/1974 Japan .

Primary Examiner—Timothy P. Callahan
Assistant Examiner—Dinh Le
Attorney, Agent, or Firm—Cushman, Darby & Cushman IP Group of Pillsbury Madison & Sutro LLP

[57] ABSTRACT

In a frequency-to-voltage converting circuit, a clamping frequency is maintained constant without being adversely influenced by circuit constants, and temperature characteristics. The frequency-to-voltage converting apparatus has voltage converting means for converting a frequency of an input pulse signal into a voltage, arranged by frequency judging means for judging whether or not the frequency of the input pulse signal reaches a predetermined clamping frequency. Setting pulse signal generating means outputs a setting pulse signal having the clamping frequency, and means for causing the voltage converting means to convert the frequency of the input pulse signal into the voltage when the frequency of the input pulse signal does not reach the clamping frequency based on a judgement result of the frequency judging means. The voltage converting means is caused to convert the clamping frequency of the setting pulse signal derived from the setting pulse signal generating means when the frequency of the input pulse signal reaches the clamping frequency.

27 Claims, 8 Drawing Sheets

CDC : COINCIDENCE DETECTING CIRCUIT

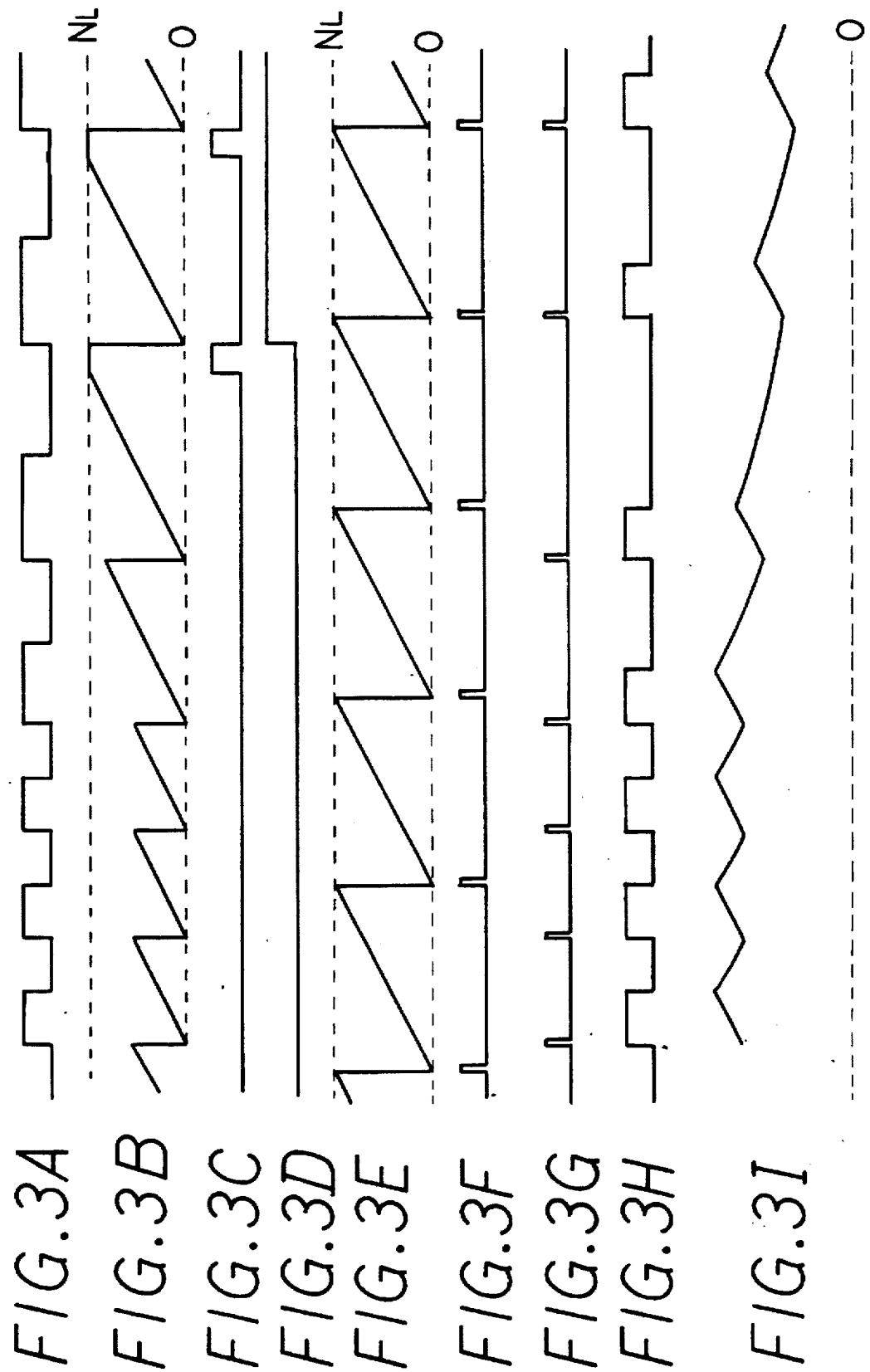

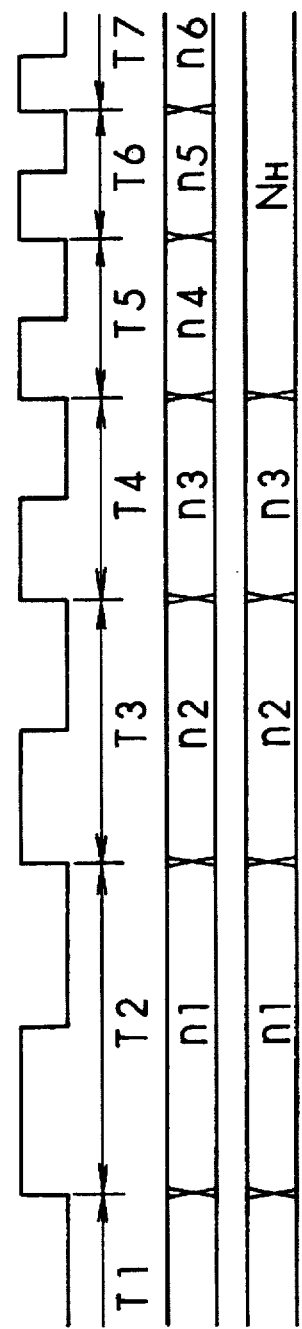
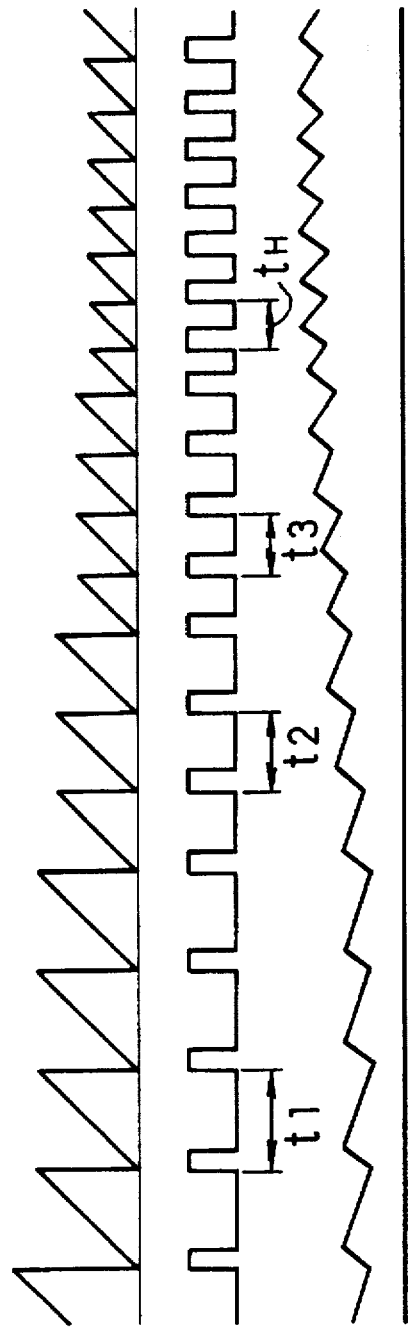
FIG.6A
FIG.6B
FIG.6C
FIG.6D
FIG.6E
FIG.6F

| ROM ADDRESS | OUTPUT DATA |
|---|---|
| 0 | d 1 |
| a 1 | d 2 |
| a 2 | d 3 |
| a 3 | d 4 |
| a 4 | d 5 |
| a 5 | |

1

FREQUENCY-TO-VOLTAGE CONVERTING APPARATUS

CROSS REFERENCE TO RELATED APPLICATION

This application is based upon and claims the benefit of priority of the prior Japanese Patent applications No. 6-117822 filed on May 31, 1994 and No. 7-95218 filed on Apr. 20, 1995, the contents of which are incorporated herein by reference.

BACKGROUND OF THE INVENTION

1. Field of the Invention

The present invention relates to a frequency-to-voltage converting apparatus for converting a frequency of an input pulse signal into a voltage.

2. Related Arts

Conventionally, waveform shaping circuits are utilized so as to shape waveforms of sensor signals derived from engine revolution sensors of vehicles and crank angle sensors thereof via electromagnetic pick-up devices by comparing the sensor signals with threshold voltages. In such waveform shaping circuits, the higher the number of engine revolutions, the larger the amplitude of the sensor signal. Conversely, the lower the number of engine revolution, the smaller the amplitude of the sensor signal. Accordingly, the threshold voltage of the waveform shaping circuit is set to a low level during low revolutions, whereas this threshold voltage is set to a high level during high revolutions.

In this case, frequency/voltage converting apparatuses are employed which have a clamp function such that the threshold voltage is selected to be constant in the range where the revolution number becomes higher than, or lower than a constant value.

FIG. 10 represents the circuit arrangement of such a conventional frequency/voltage converting apparatus. In FIG. 10, the pulse signal having a constant pulse width is outputted from the one-shot multivibrator 2 on each rising edge of the input pulse signal input from the signal input terminal 1. In response to this pulse signal, the switch (switching means such as transistor) 34 in the voltage converting circuit 3 is turned ON, a constant current is supplied from the constant current source 33 to the time constant circuit arranged by the resistor 31 and the capacitor 32, so that the output voltage of the voltage converting circuit 3 is increased. When the pulse signal is dropped down, this switch 34 is turned OFF, so that the output voltage of the voltage converting circuit 3 is lowered in accordance with a preselected time constant.

While the above-described operation is repeated, the voltage converting circuit 3 produces such a voltage in accordance with the duty ratio of the pulse signal derived from the one-shot multivibrator 2, namely the frequency of the input pulse signal.

Subsequently, this voltage is clamped by employing the clamping circuit 100. This clamping circuit 100 is arranged by the transistors 101 to 104, the constant current sources 105, 106, and the constant voltage sources 107, 108 for setting the clamping voltages $V_H$, $V_L$, $V_{BE}$ ($V_{BE}$ is base-to-emitter voltage of transistor). The clamping circuit 100 clamps the input pulse signal in such a manner that the clamped outputs become $V_H$ and $V_L$ when the input frequency is lower than and higher than a predetermined frequency.

The above-described circuit arrangement exhibits, however, such a problem that when either the values of the resistor 31 and the capacitor 32 are fluctuated or the current value of the constant current source 33 is fluctuated, the clamping frequencies are fluctuated. There is another problem in that the clamping frequencies are also fluctuated by the temperature characteristics of in the clamping circuit 100. Then, as illustrated in FIG. 4A, there is such a problem that the clamping frequency of the output voltage derived from the output terminal 35 is shifted from $f_{L1}$ to $f_{L2}$ and from $f_{H1}$ to $f_{H2}$ due to these variations.

SUMMARY OF THE INVENTION

The present invention has been made to solve the above-described conventional problems, and therefore, has a first object to provide a frequency/voltage converting apparatus such that a clamping frequency used to clamp an input pulse signal can be maintained constant without being adversely influenced by a circuit constant and the like when a voltage conversion is carried out.

Further, a second object of the present invention is to provide a frequency/voltage converting apparatus in which not only the clamping operation, but also a frequency-to-voltage converting operation which is capable of obtaining a pattern frequency/voltage characteristic varied with a preselected frequency are able to keep constant, this varying frequency without being adversely influenced by the circuit constants and the like.

To achieve the above-described objects, according to the present invention, in a frequency-to-voltage converting apparatus, before a frequency of an input pulse signal is converted into a voltage, this frequency of the input pulse signal is clamped. Conventionally, on the contrary, after the frequency of the input pulse signal has been converted into the voltage, this converted voltage is clamped.

Accordingly, according to a first feature of the present invention, a frequency-to-voltage converting apparatus having voltage converting means for converting a frequency of an input pulse signal into a voltage, is characterized by comprising: frequency judging means for judging whether or not the frequency of the input pulse signal reaches a predetermined clamping frequency; setting pulse signal generating means for outputting a setting pulse signal having the clamping frequency; and means for causing the voltage converting means to convert the frequency of the input pulse signal into the voltage when the frequency of the input pulse signal does not reach the clamping frequency based on a judgement result of the frequency judging means, and for causing the voltage converting means to convert the clamping frequency of the setting pulse signal derived from the setting pulse signal generating means when the frequency of the input pulse signal reaches the clamping frequency.

According to a second feature of the present invention, a frequency-to-voltage converting apparatus is characterized by comprising: counting means for counting a time period of an input pulse signal every time period; comparing means for comparing the time period of the input pulse signal counted by the counting means with a time period set in correspondence with a clamping frequency every time period of the input pulse signal to output a comparison result; setting pulse signal generating means for generating a setting pulse signal having the set time period; selecting/outputting means for selecting one of the input pulse signal and the setting pulse signal produced from the setting pulse signal generating means based on the comparison result of the comparing means to output a pulse signal for a voltage conversion purpose; and voltage converting means for converting a frequency of the pulse signal outputted from the selecting/outputting means into a voltage.

According to a third feature of the present invention, a frequency-to-voltage converting apparatus is characterized by comprising: edge detecting means for detecting an edge of an input pulse signal to output an edge detection signal; counting means for counting a time period of the input pulse signal every time period every time the edge detection signal is outputted from the edge detecting means; setting data outputting means for outputting data having a time period set in correspondence with a clamping frequency; comparing means for comparing data indicative of the time period of the input pulse signal counted by the counting means with the data having the set time period outputted from the setting data outputting means to produce a comparison result; setting pulse signal generating means for generating a setting pulse signal having the set time period; selecting/outputting means for selecting one of the input pulse signal and the setting pulse signal produced from the setting pulse signal generating means based on the comparison result of the comparing means to output a pulse signal for a voltage conversion purpose; and voltage converting means for converting a frequency of the pulse signal outputted from the selecting/outputting means into a voltage.

According to a fourth feature of the present invention, in the frequency-to-voltage converting apparatus as mentioned in the second or third feature, the selecting/outputting means may include select means for selecting one of the input pulse signal and the set pulse signal from the setting pulse generating means, and constant-width pulse signal generating means for generating a pulse signal with a constant width triggered by an edge of an output from the select means.

According to a fifth feature of the present invention, in the frequency-to-voltage converting apparatus as mentioned in the fourth feature, the voltage converting means may include switching means operable in response to the pulse signal with the constant width derived from the constant-width pulse signal generating means, and supply a constant current from a constant current source via the switching means to a time constant circuit constructed of a resistor and a capacitor connected in parallel to the resistor.

According to a sixth feature of the present invention, in the frequency-to-voltage converting apparatus as mentioned in any one of the second through fifth features of the present invention, clock generating means for generating a clock having a predetermined frequency, may be further employed, the counting means may perform the counting operation based on the clock generated from the clock generating means; and the setting pulse signal generating means may generate the pulse signal having the set time period by frequency-dividing the clock produced from the clock generating means.

In accordance with the present invention as defined in the first to sixth features, before the frequency of the input pulse signal is converted into the voltage, it is judged whether or not this frequency reaches a predetermined clamping frequency by the frequency detecting means. When the frequency of the input pulse signal does not reach the clamping frequency, the frequency of the input pulse signal is converted into the voltage by the voltage converting means. When the frequency of the input pulse signal reaches the clamping frequency, the clamping frequency of the setting pulse signal derived from the setting pulse signal means is converted into the voltage by the voltage converting means.

As a consequence, before the frequency of the input pulse signal is converted into the voltage, this frequency is clamped, so that the clamping frequency can be kept constant without being adversely influenced by the circuit constants during the voltage conversion. In particular, this clamping frequency is set by employing a crystal oscillator, so that such a clamping characteristic having high frequency precision can be obtained.

In the present invention as described in the above-described first to sixth features, to achieve the first object, the frequency of the input pulse signal is clamped before being converted into the clamped voltage. The inventors discovered that the clamping operation is not always required, but if the frequency-to-voltage characteristic of the pattern varying at a predetermined frequency can be obtained, then this changing frequency can be maintained constant without being adversely influenced by the circuit constant and the like.

According to a seventh feature of the present invention, a frequency-to-voltage converting apparatus is characterized by comprising: time period measuring means for measuring a time period of an input pulse signal to output time period data; time period data converting means for converting the outputted time period data so as to obtain a frequency-to-voltage characteristic of a pattern varied at preselected frequencies; pulse signal generating means for generating such a pulse signal having a time period corresponding to the converted time period data and a constant pulse width based upon the converted time period data; and voltage outputting means for outputting a voltage proportional to a duty ratio of the produced pulse signal.

According to an eighth feature of the present invention, in the frequency-to-voltage converting apparatus as mentioned in the seventh feature, the time period data converting means may include clamping means for clamping the time period data based on clamping data.

According to a ninth feature of the present invention, in the frequency-to-voltage converting apparatus as mentioned in the seventh feature, the time period data converting means may include storage means for storing a conversion characteristic used to convert the time period data.

According to a tenth feature of the present invention, in the frequency-to-voltage converting apparatus as mentioned in the ninth feature, the storage means may store a conversion characteristic such that the time period data to be converted with respect to a dimension of the time period data is charged in a stepwise manner.

In accordance with the present invention as described in the seventh to tenth features, the time period of the input pulse signal is measured to obtain time period data, the data is converted so as to obtain the frequency/voltage characteristic of the pattern variable at a preselected frequency, and then the voltage is obtained based on this converted time period data.

Accordingly, the frequency/voltage conversion having a desirable charging pattern can be performed by employing the data conversion for the time period data. In this case, the charge at the desired frequency can be maintained constant without being adversely influenced by the circuit constants when the voltage conversion is carried out in a similar manner to the above case.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIG. 3A to FIG. 3I are waveform charts for indicating waveforms of signals appearing at various circuit portions shown in FIG. 2;

FIG. 6A to FIG. 6F are waveform charts for showing waveforms of signals appearing in various circuit portions shown in FIG. 5;

DETAILED DESCRIPTION OF THE PRESENTLY PREFERRED EXEMPLARY EMBODIMENTS

Figure 1:
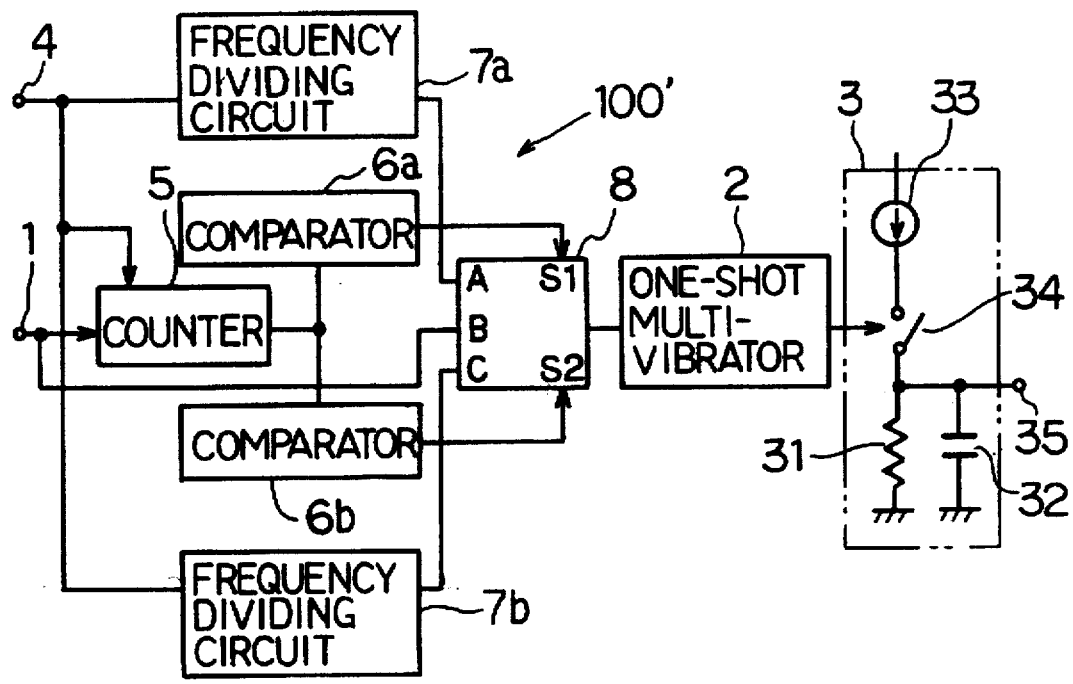
FIG. 1 schematically shows a general circuit arrangement of a frequency/voltage converting apparatus according to a first embodiment of the present invention.
Figure 10:
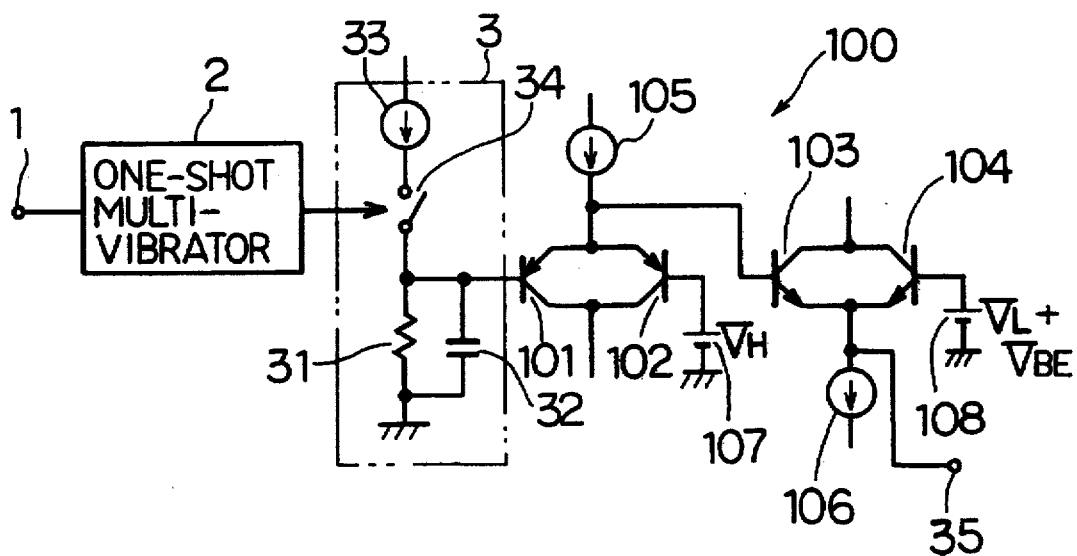
FIG. 10 is the schematic circuit arrangement of the conventional frequency/voltage converting apparatus.

Referring now to the drawings, a frequency-to-voltage converting apparatus according to the present invention will be described in detail.

(FIRST EMBODIMENT)

FIG. 1 is a diagram for showing an overall circuit arrangement of the frequency/voltage converting apparatus according to a first embodiment of the present invention. In this embodiment, a clamping circuit 100' is interposed between a signal input terminal 1 and a one-shot multivibrator 2.

In this clamping circuit 100', a period of a pulse signal entered into a signal input terminal 1 is counted by a counter 5 by using a clock supplied from a clock input terminal 4. The count value counted by this counter 5 is compared with a first setting value set in correspondence with a high clamping frequency and a second setting value set in correspondence with a low clamping frequency in a first a comparator circuit 6a and a second comparator circuit 6b.

When the count value of the counter 5 becomes higher than, or equal to the first setting value, a first comparison signal is outputted from the first comparator circuit 6a, whereas when the count value of the counter 5 becomes lower than, or equal to the second setting value, a second comparison signal is outputted from the second comparator circuit 6b.

Frequency dividing circuits 7a and 7b frequency-divide the clock derived from the clock input terminal 4 to thereby output first and second setting pulse signals. The frequencies of these first and second setting pulse signals are set to the high clamping frequency and the low clamping frequency, which are used to the frequency of the input pulse signal.

A selector 8 selects one of the above-described first, second setting pulse signals and input pulse signal, which have been frequency-divided by the frequency dividing circuits 7a, 7b based on the outputs from the first and second comparator circuits 6a, 6b, and then outputs the selected signal to the one-shot multivibrator 2. In other words, when the frequency of the input pulse signal is present between the high clamping frequency and the low clamping frequency, and the first and second comparison signals are not outputted from the comparator circuits 6a, 6b, the input pulse signal is selected by this selector 8. When the frequency of the input pulse signal is higher than 20 the high clamping frequency and thus the first comparison signal is outputted, the first setting pulse signal is selected by the selector 8. When the frequency of the input pulse signal is below the low clamping frequency and thus the second comparison signal is outputted, the second setting pulse signal is selected by the selector 8.

As a consequence, the frequency of the signal outputted from the selector 8 is limited to the high clamping frequency and the low clamping frequency with respect to the frequency of the input pulse signal. The duty ratio of the pulse signal outputted from the one-shot multivibrator 2 and for controlling the switch 34 is restricted within a predetermined range. A converted voltage value produced by the voltage converting operation by a constant current source 33, a resistor 31, and a capacitor 32 is also limited within a selected range, and becomes a clamped voltage.

It should be noted that since the precision of the frequencies to be clamped is equal to the precision of the clock frequency supplied from the clock input terminal 4, if a crystal oscillator and the like are employed, then high clamping precision can be easily achieved. Also, the clamping frequency does not depend on the constants of the resistor 31 and the capacitor 32. This clamping frequency may be readily set/varied by changing the setting values of the first and second comparator circuits 6a, 6b, and the first, second setting values.

Figure 2:
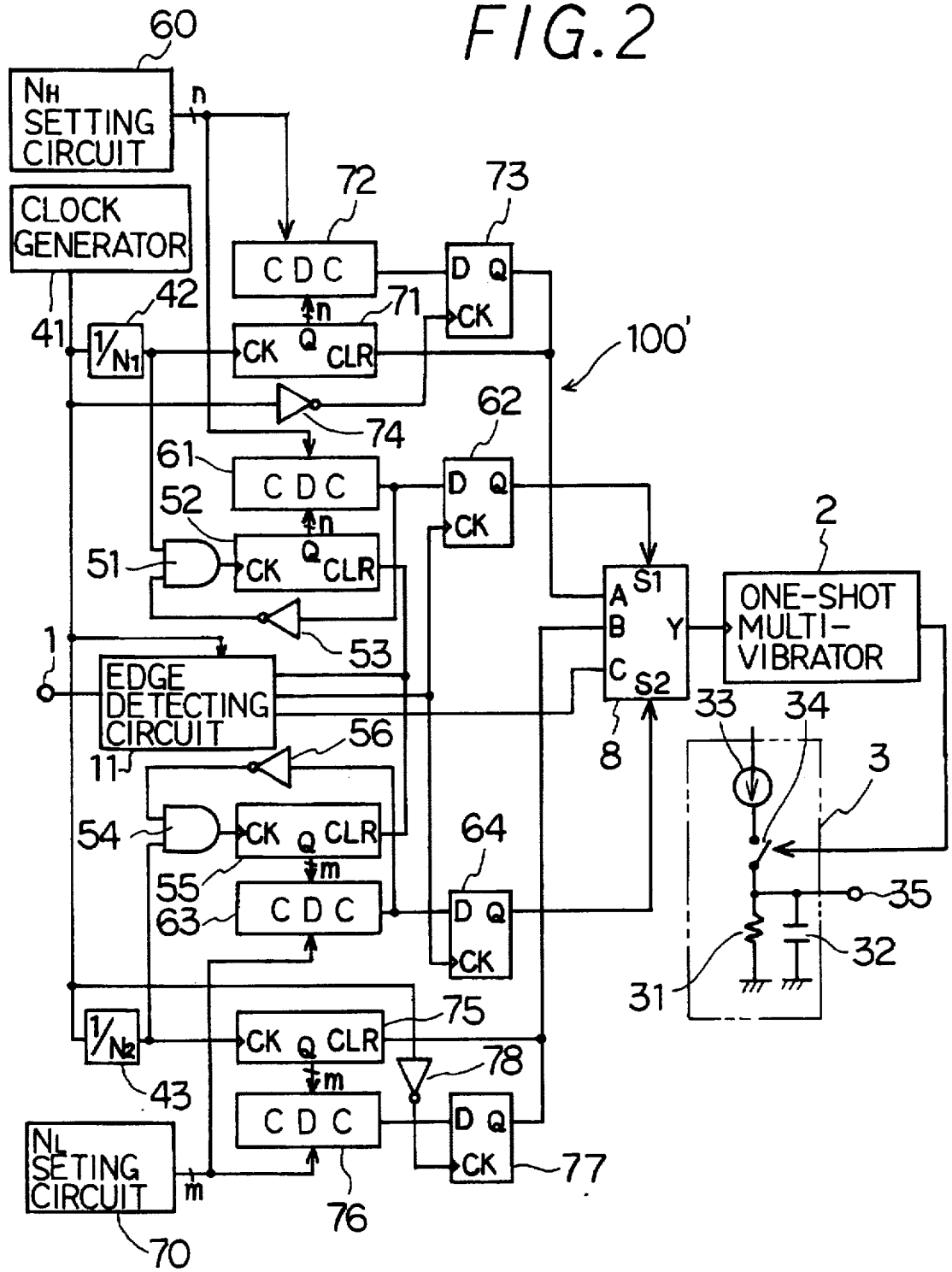
FIG. 2 is a detailed circuit arrangement of the frequency/voltage converting apparatus shown in FIG. 1.

Next, more detailed descriptions of the first embodiment will be made with reference to FIG. 2. FIG. 2 shows a detailed circuit arrangement of the frequency/voltage converting apparatus of FIG. 1.

In FIG. 2, a rising edge of an input pulse signal having a frequency of "$f_{in}$" entered into the signal input terminal 1 is detected by an edge detecting circuit 11. A clock having a frequency of "$f_{CLK}$" derived from a clock generator 41 is frequency-divided into $1/N_1$ and $1/N_2$ by frequency dividers 42 and 43.

An AND gate circuit 51, an n-bit binary counter 52, and an inverter circuit 53 constitute a first counter. The first counter counts an edge detection signal from the edge detecting circuit 11 in response to the clock frequency-divided by $1/N_1$ in the frequency divider 42. Similarly, a second counter constituted by an AND gate circuit 54, an m-bit binary counter 55 and an inverter circuit 56 counts an edge detection signal derived from the edge detecting circuit 11 in response to the clock frequency-divided by $1/N_2$ in the frequency divider 43. Since the counting operations of the first and second counters are repeatedly performed every time the edge detection signal is received from the edge detecting circuit 11, this count value indicates the time period of the input pulse signal.

An $N_H$ setting circuit 60 and an $N_L$ setting circuit 70 output binary data $N_H$ corresponding to the high clamping frequency and binary data $N_L$ corresponding to the low clamping frequency, respectively.

Both of a coincidence detecting circuit 61 and a D type flip-flop 62 constitute a first comparator circuit. The coincidence detecting circuit 61 compares the binary data $N_H$ derived from the $N_H$ setting circuit 60 with the count value of the n-bit counter 52 to output a high level signal when both values are coincident with each other. The D type flip-flop 62 holds this high level signal upon receipt of the next edge detection signal from the edge detecting circuit 11. Also, in the second comparator circuit constituted by a coincidence detecting circuit 63 and a D type flip-flop 64, this coincidence detecting circuit 63 compares the binary data $N_L$ from the $N_L$ setting circuit 70 with the count value of the m-bit counter 55 to output a high level signal when both of these values are coincident with each other. Then, the D type flip-flop 64 holds this high level signal upon receipt of the next edge detection signal derived from the edge detecting circuit 11.

It should be noted that there are two edge detection signals derived from the edge detecting circuit 11, namely one edge detection signal to the D type flip-flops 62, 64, and the other edge detection signal to the first and second counters 52, 55. The first-mentioned edge detection signal is outputted earlier than the second-mentioned edge detection signal in view of temporal aspect. As a result, after the output signals of the coincidence detecting circuits 61 and 63 have been stored into the D type flip-flops 62 and 64, the first and second counters 52 and 55 are cleared.

With the above-described operations, when the frequency "$f_{in}$" of the input pulse signal is defined by $f_{in} \leq f_{CLK}/(N_1 \times N_H)$, the level of the output signal from the flip-flop 62 becomes high. Similarly, when the frequency "$f_{in}$" is defined by $f_{in} \leq f_{CLK}/(N_2 \times N_L)$, the level of the output signal from the flip-flop 64 becomes high. Now, with respect to the high clamping frequency $f_H$ and the low clamping frequency $f_L$, the values of $N_1$, $N_2$, $N_H$, $N_L$ are so selected that the following relationships can be satisfied:

$$f_H = f_{CLK}/(N_1 \times N_H) \text{ and } f_L = f_{CLK}/(N_2 \times N_L).$$

As a result, the level of the output signal from the flip-flop 62 becomes high when the signal frequency $f_{in}$ is lower than, or equal to $f_H$, whereas the level of this output signal becomes low when the signal frequency fin is higher than The level of the output signal from the flip-flop 64 becomes high when the signal frequency $f_{in}$ is lower than, or equal to $f_L$, whereas the level of this output signal becomes low when the signal frequency $f_{in}$ is higher than $f_L$.

When the high level signal is outputted from the coincidence detecting circuit 61, the level of the output signal from the inverter circuit 53 becomes low and the AND circuit 51 is closed, so that the counting operation of the counter 52 is stopped. As a result, since the counter 52 keeps its count value, the high level signal is continuously outputted from the coincidence detecting circuit 61. When the high level signal is outputted from the coincidence detecting circuit 63, the counting operation of the counter 55 is similarly stopped, so that the high level signal is continuously outputted from the coincidence detecting circuit 63.

An n-bit binary counter 71, a coincidence detecting circuit 72, a D type flip-flop 73, and an inverter circuit 74 constitute a first frequency dividing circuit which further frequency-divides by $1/N_H$ the clock frequency-divided by $1/N_1$ in the frequency divider 42.

In other words, the clock which has been frequency-divided by $1/N_1$ in the frequency divider 42 is counted by the n-bit binary counter 71. When the coincidence detecting circuit 72 detects that this count value is made coincident with the binary data $N_H$, the high level signal is outputted from this coincidence detecting circuit 72. The D type flip-flop 73 holds this high level signal at an input timing of the clock supplied from the clock generator 41 via the inverter circuit 74, and then outputs the high level signal. The binary counter 71 is cleared in response to the high level signal derived from this D type flip-flop 73. The D type flip-flop 73 causes the level of the output signal to become low upon receipt of the succeeding clock supplied from the clock generator 41 via the inverter circuit 74. As a consequence, since the above-described operation is repeatedly performed, a continuous period pulse having a frequency of $f_{CLK}/(N_1 \times N_H)$ and a width of $1/f_{CLK}$ is outputted from the D type flip-flop 73 with respect to the clock frequency $f_{CLK}$ of the clock generator 41.

Similarly, an m-bit binary counter 75, a coincidence detecting circuit 76, a D type flip-flop 77, and an inverter circuit 78 constitute a second frequency dividing circuit. Similar to the above-described operations, this second frequency dividing circuit further frequency-divides by $1/N_L$ the clock frequency-divided by $1/N_2$ in the frequency divider 43. As a consequence, such a continuous period pulse having a frequency of $f_{CLK}/(N_2 \times N_L)$ and a width of $1/f_{CLK}$ is outputted from the D type flip-flop 77.

The selector 8 selects an input terminal A when a low level signal is inputted into a select terminal S1, and selects an input terminal B when a high level signal is inputted into another select terminal S2, and further selects an input terminal C when a high level signal is inputted to the select terminal S1 and also a low level signal is inputted to the select terminal S2.

The one-shot multivibrator 2 and the voltage converting circuit 3 own the same circuit arrangements as those of FIG. 1. This one-shot multivibrator 2 is triggered by the rising edge of the pulse signal derived from the selector 8, thereby producing a pulse signal having a constant width. In response to the pulse signal with the constant width, the voltage converting circuit 3 performs the voltage converting operation.

The frequency/voltage converting operation with the above-described circuit arrangement will now be described.

When the input pulse signal of the signal input terminal 1 is raised, the rising edge of this pulse signal is detected by the edge detecting circuit 11, and both of the counter 52 and the counter 55 are reset. Thereafter, these counters 52 and 55 are counted up in response to the clocks which are produced by frequency-dividing the clock derived from the clock generator 41 by $1/N_1$ and $1/N_2$, respectively. The counting operations of these counters 52 and 55 are repeated in synchronism with the rising edge of the input pulse signal.

It is assumed that the frequency of this input pulse signal is located between the high clamping frequency corresponding to the binary data $N_H$ and the low clamping frequency corresponding to the binary data $N_L$. When the count value of the counter 52 is coincident with the binary data $N_H$, the level of the coincidence detection signal outputted from the coincidence detecting circuit 61 becomes high. In response to this high level signal, the counting operation by the counter 52 is stopped by the gating operation of the AND circuit 51 via the inverter circuit 53.

At a rising edge of the succeeding circuit pulse signal supplied to the signal input terminal 1, the high level signal of the coincidence detecting circuit 61 is stored into the D type flip-flop 62. Thereafter, the counter 52 is cleared. Accordingly, while the frequency of the input pulse signal is lower than the high clamping frequency, the D type flip-flop 62 holds the high level signal and outputs this high level signal.

On the other hand, before the count value of the counter 55 is coincident with the binary data $N_L$, the low level signal from the coincidence detecting circuit 63 is stored into the D type flip-flop 64 at a rising edge of the next input pulse signal, and thereafter the counter 55 is cleared. As a consequence, the D type flip-flop 64 outputs the low level signal.

Since the high level signal is inputted to the select terminal S1 of the selector 8 and the low level signal is inputted to the select terminal S2, the selector 8 selects the input terminal C, so that the input pulse signal whose edge has been detected by the edge detecting circuit 11 is outputted from this selector 8 to the one-shot multivibrator 2. As a result, these one-shot multivibrator 2 and the voltage converting circuit 3 are operated so as to convert the frequency of the input pulse signal into the voltage which will then be outputted from the output terminal 35.

Subsequently, a description will now be made of such a case that the frequency of the input pulse signal is lower than the low clamping frequency corresponding to the data $N_L$.

In this case, since the counted value of the counter 55 is coincident with the binary data $N_L$ before the next input pulse signal of the signal input terminal 1 is raised, the counter output signal becomes a high level, so that this counter 55 stops its counting operation by the gating operation of the AND gate circuit 54 via the inverter circuit 56. Then, at the rising edge of the succeeding signal of the signal input terminal 1, the high level signal of the coincidence detecting circuit 63 is stored into the D type flip-flop 64.

Since the high level signal is entered into the select terminal S2, the selector 8 selects the input terminal B and thus outputs the signal having the frequency of $f_{CLK}/(N_2 \times N_L)$ derived from the D type flip-flop 77 to the one-shot multivibrator 2. As a consequence, this one-shot multivibrator 2 and the voltage converting circuit 3 are so operated as to convert the frequency $f_{CLK}/(N_2 \times N_L)$ of the signal into the voltage. This voltage is outputted from the output terminal 35 as a constant voltage.

Next, a description is made of another case that the frequency of the input pulse signal is higher than the high clamping frequency corresponding to the data $N_H$.

In this case, before the counted value of the counter 52 is coincident with the binary data $N_H$, the low level signal derived from the coincidence detecting circuit 61 is stored into the D type flip-flop 62 at the succeeding rising edge of the input pulse signal. Thereafter, the counter 52 is cleared. As a result, the D type flip-flop 62 stores and outputs the low level signal.

Since the low level signal is entered into the select terminal S1 of the selector 8, the input terminal A is selected. Then, the selector 8 outputs the signal having the frequency of $f_{CLK}/(N_1 \times N_H)$ outputted from the D type flip-flop 73 to the one-shot multivibrator 2. As a result, this one-shot multivibrator 2 and the voltage converting circuit 3 are operated so as to convert the frequency $f_{CLK}/(N_1 \times N_H)$ of the signal into the corresponding voltage which is outputted as a constant voltage from the output terminal 35.

Referring now to a waveform chart shown in FIG. 3A to FIG. 3I, a description will be made of such a case that the frequency of the input pulse signal is lowered (namely, the time period thereof is prolonged).

An input pulse signal shown in FIG. 3A is inputted to the signal input terminal 1. The counter 55 repeats its counting operation in synchronism with the rising portion of this input pulse signal, as represented in FIG. 3B. While the frequency of the input pulse signal is higher than the low clamping frequency, the counted value of the counter 55 does not reach the binary data $N_L$, the coincidence detecting circuit 63 maintains the low level output (see FIG. 3C) and also the D type flip-flop 64 maintains the low level output (see FIG. 3D).

On the other hand, the counter 75 repeats its counting operation as illustrated in FIG. 3E, and the D type flip-flop 77 outputs the signal having the frequency $f_{CLK}/(N_2 \times N_L)$ as shown in FIG. 3F.

Accordingly, while the frequency of the input pulse signal is higher than the low clamping frequency, the selector 8 outputs such a pulse signal (see FIG. 3G) produced by detecting the edge of the input pulse signal. In response to this pulse, the voltage converting circuit 3 outputs a voltage as shown in FIG. 3I.

Now if the frequency of the input pulse signal becomes lower than the low clamping frequency, then the counted value of the counter 55 reaches the binary data $N_L$, the coincidence detecting circuit 63 outputs the high level signal, and the D type flip-flop 64 holds and outputs the high level signal (refer to FIGS. 3B, 3C and 3D). As a consequence, the selector 8 selects the signal having the frequency of $f_{CLK}/(N_2 \times N_L)$ which will then be outputted. In accordance with this output, a voltage to be converted by the voltage converting circuit 3 is changed into a constant voltage, as shown in FIG. 3I.

It should be understood that since signal waveforms appearing in such a condition that the frequency of the input pulse signal is increased (namely, time period is lowered) may be sufficiently considered from the above-described operation explanations, no further explanations thereof are made.

As previously described, in accordance with the above-described first embodiment, the output voltage value can be clamped to a constant voltage value when the frequency "$f_{in}$" of the input pulse signal is lower than, or equal to the low clamping frequency, and is higher than, or equal to the high clamping frequency, which are determined by the clock frequency $f_{CLK}$, the frequency dividing ratios $N_1$, $N_2$, D and the internal binary data $N_H$, $N_L$. As a consequence, as illustrated in FIG. 4B, even when the output voltage is changed from $V_{L1}$ to $V_{L2}$ and from $V_{H1}$ to $V_{H2}$ due to fluctuations in the circuit constants in the voltage converting circuit 3, the clamping frequency can be made constant. Since the precision of this clamping frequency is determined by only the precision of the clock frequency, a crystal oscillator and the like are employed in the clock generator 41, so that it is possible to achieve such a clamping characteristic with high frequency precision.

Figure 4A:
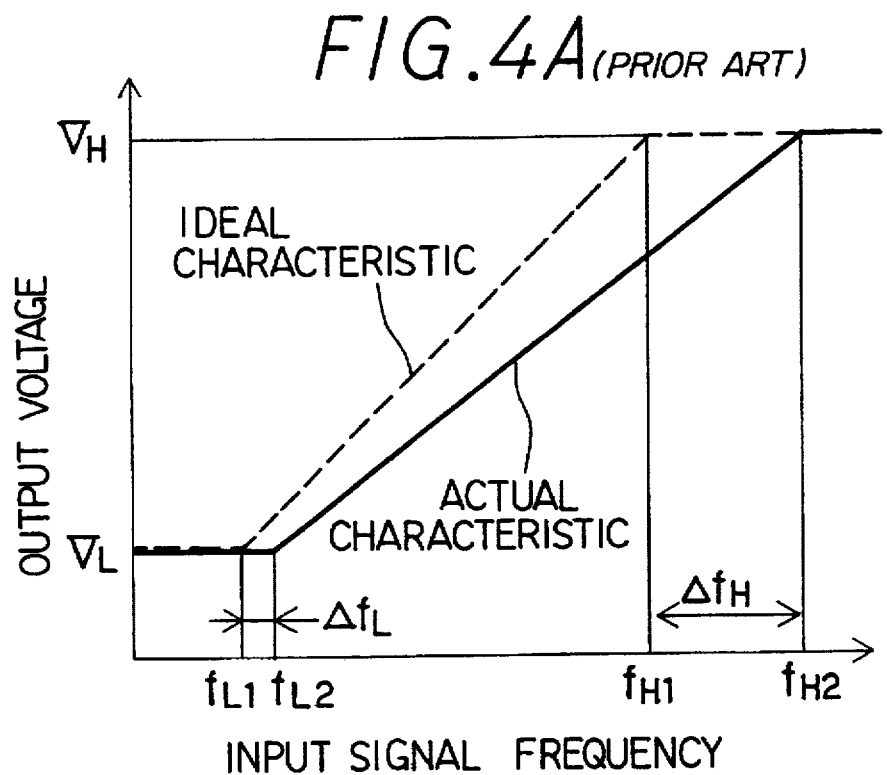
FIG. 4A and FIG. 4B graphically represent characteristic diagrams for the frequencies of input pulse signals and output voltages in the conventional circuit and the present embodiment, respectively.
Figure 4B:
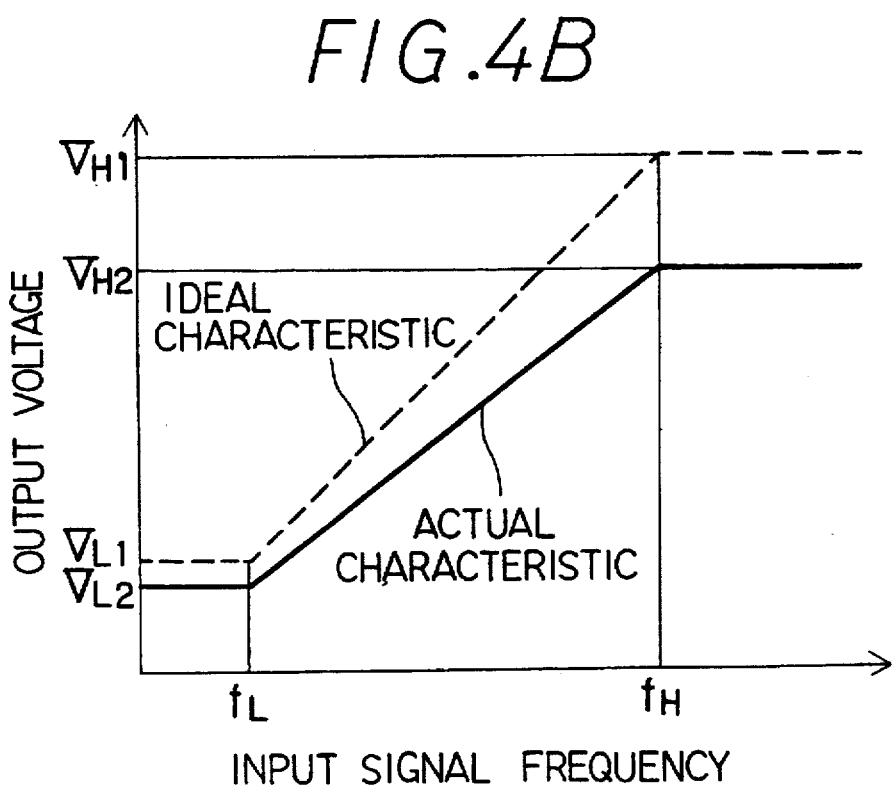

It should also be noted that FIG. 4A and FIG. 4B are graphically represented by the logarithmic abscissas, and indicate in an exaggerated manner that the actual characteristic is shifted from the idea characteristic when the frequency-to-voltage conversion gain becomes smaller than the desirable characteristic due to fluctuation in the circuit constants.

In accordance with this embodiment, the clamping frequency may be arbitrarily varied so as to accept the system requirement by employing such a manner to store the values of the internal binary data $N_H$ and $N_L$ into the register and the like.

It should be noted that although the clocks are obtained in the above-described embodiment by frequency-dividing a single clock by the frequency dividers 42, 43 and the first, second frequency dividing circuit, alternatively independent clocks having various different frequencies may be separately employed. In this alternative case, the frequency used to clamp the input pulse signal must be made coincident with the upper limit frequency and the lower limit frequency, which are set by this clock.

Also, when such independent clocks are separately used, one-shot multivibrators may be provided with respect to each of these clocks, and output signals from these one-shot multivibrators may be selected so as to be supplied to the voltage converting circuit 3.

Furthermore, although the frequency of the input pulse signal is clamped based on the upper limit frequency and the lower limit frequency in the above-described first embodiment, the frequency of the input pulse signal may be clamped based upon only one of these upper/lower limit frequencies in accordance with a desirable output characteristic.

(SECOND EMBODIMENT)

In this second embodiment, a time period of an input pulse signal is converted into digital time period data, this time period data is clamped by the binary data Ns and $N_L$ corresponding to the high clamping frequency and the low clamping frequency, and then a pulse signal having a time period corresponding to the clamped time period data is produced based upon this clamped time period data. Based on this pulse signal, it is converted into a voltage by the one-shot multivibrator 2 and the voltage converting circuit 3 in a similar manner to that of the first embodiment.

Figure 5:
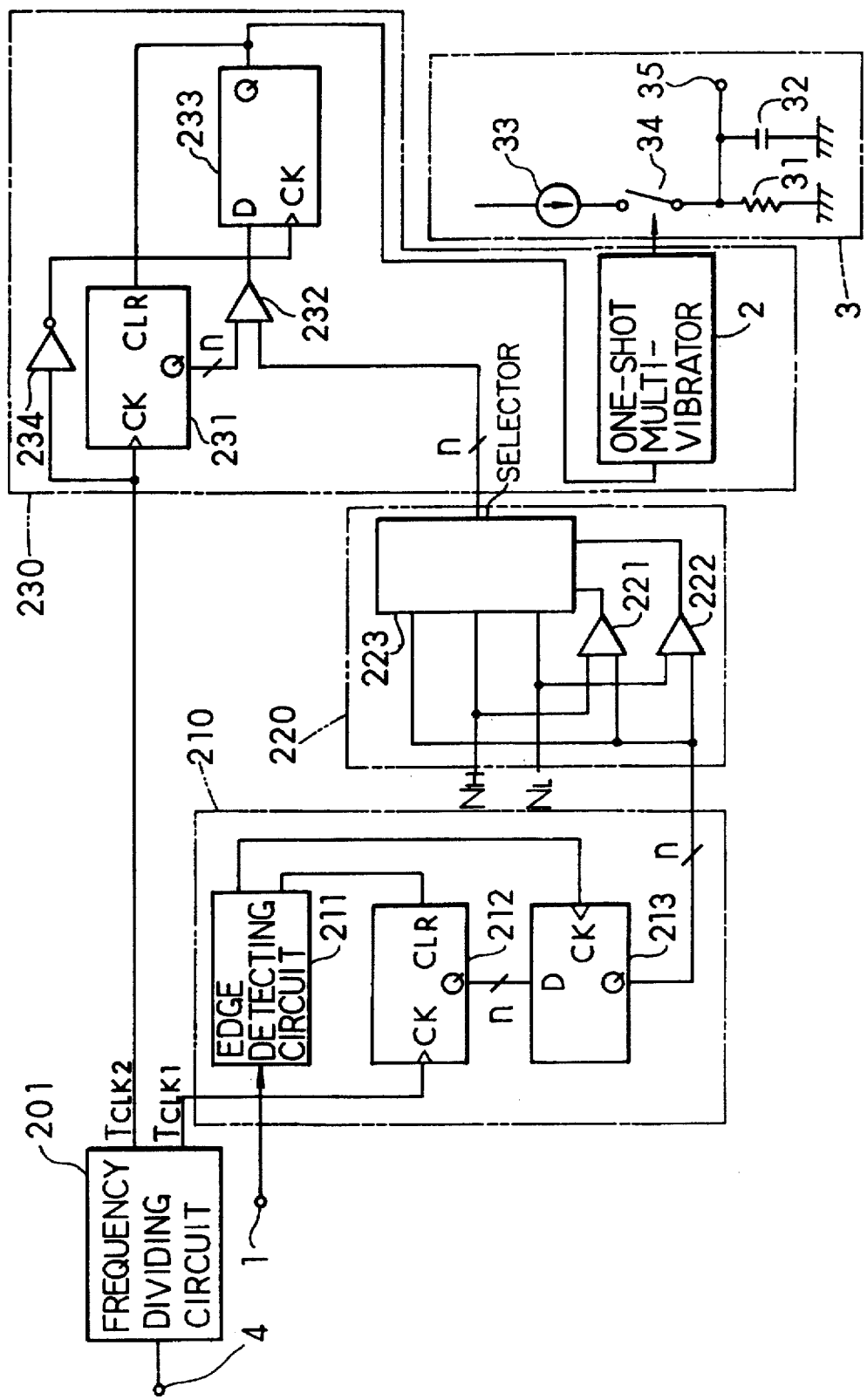
FIG. 5 is a schematic circuit arrangement of a frequency/voltage converting apparatus according to a second embodiment of the present invention.

In FIG. 5, there is shown a concrete circuit arrangement according to the second embodiment.

In this circuit arrangement, a frequency dividing circuit 201 frequency-divides a clock supplied from a clock input terminal 4, thereby producing a clock having a time period of $T_{CLK1}$ and a clock having a time period of $T_{CLK2}$.

A counting circuit 210 counts the input pulse signal supplied from the signal input terminal 1 to output digital time period data indicative of the time period of this input pulse signal. This counting circuit 210 is constructed of an edge detecting circuit 211, a counter 212, and an n-bit D type flip-flop 213. The edge detecting circuit 211 detects a rising edge of an input pulse signal to output an edge detection signal. The counter 212 counts the clock having the time period $T_{CLK1}$ and is cleared by the edge detection signal. The n-bit D type flip-flop 213 holds the counted value of the counter 212 at a timing of the edge detection signal derived from the edge detecting circuit 211. Accordingly, the number of clocks counted during the rising edge of the input pulse signal is outputted as digital time period data indicative of the time period of the input pulse signal.

This digital time period data is inputted into a time period setting circuit 220 (time period data converting means) and is clamped based upon the binary data $N_L$ and $N_H$ respectively corresponding to the high and low clamping frequency. This time period setting circuit 220 is arranged by digital comparators 221, 222, and a selector 223. The digital comparators 221 and 222 compare the time period data with the binary data $N_H$, $N_L$ derived from circuits (not shown in FIG. 5) similar to the $N_H$ setting circuit 60 and the $N_L$ setting circuit 70 as shown in FIG. 2. The selector 223 selects any one of these time period data, and binary data $N_H$, $N_L$ based on the comparison result. Accordingly, the time period data clamped by the binary data $N_H$ and $N_L$ are outputted from the selector 223.

A pulse signal generating circuit 230 outputs a pulse signal having a constant pulse width and also a time period corresponding to the outputted time period data. This pulse generating circuit 230 is arranged by a counter 231 for counting the clock having the time period of $T_{CLK2}$ outputted from a frequency dividing circuit 201, a digital comparator 232 for comparing the counted value of this counter 231 with the time period data outputted from the time period setting circuit 220, and a D type flip-flop 233 for holding the output of this digital comparator 233. The pulse signal generating circuit 230 is further constructed of an inverter 234 for outputting such a clock produced by inverting the clock having the time period $T_{CLK2}$ to this D type flip-flop 233, and a one-shot multivibrator 2.

Then, the counter 231 counts the clock having the time period of $T_{CLK2}$. When this count value reaches the time period data, the digital comparator 232 outputs the high level signal, this high level signal is held by the D type flip-flop 233 and also the counter 231 is cleared. Since the counter 231 is cleared, the level of the signal outputted from the digital comparator 232 becomes low, and the level of the signal outputted from the D type flip-flop 233 is changed into a low level in response to the succeeding clock from the inverter 234. As a consequence, the above-described operation is repeatedly performed, so that such a pulse signal having a pulse signal having a pulse width of $T_{CLK2}$ and a time period corresponding to the time period data is outputted from the D type flip-flop 233.

In response to this output pulse signal, an output voltage is formed by the one-shot multivibrator 2 and the voltage converting circuit 3 in a similar manner to that of the first embodiment.

In the frequency/voltage converting apparatus with the above-described circuit arrangement, operations thereof will now be explained with reference to a timing chart shown in FIG. 6A to FIG. 6F. FIG. 6A to FIG. 6F schematically show such a condition that the frequency of the input pulse signal is increased, namely the time period thereof is shortened as the time has elapsed.

A rising edge of the input pulse signal shown in FIG. 6A is detected by the edge detecting circuit 211, the counted value of the counter 212 is acquired by the D type flip-flop 213 in response to this edge detection signal, and the counter 212 is reset just after the acquisition of this counted value. In FIG. 6B, there is shown output data (time period data) of the D type flip-flop 213. Here, values n1, n2, n3, ..., correspond to the time periods T1, T2, T3, ....

While this time period data is smaller than $N_L$ and larger than $N_H$, the selector 233 outputs this time period data, FIG. 6C represents this outputted time period data.

The counter 231 counts the clock having the time period $T_{CLK2}$ supplied from the frequency dividing circuit 201, and this counted value is compared with the time period data by the comparator 232. Then, every time the counted value of the counter 231 becomes larger than, or equal to, the time period data, the counter 231 is reset and the pulse signal having the pulse width $T_{CLK2}$ is outputted from the D type flip-flop 233.

A change in the counted values of this counter 231 is indicated in FIG. 6D, and the waveform of the pulse signal outputted from the D type flip-flop 233 is shown in FIG. 6E. In this drawing, the time periods t1, t2, t3 and tH of the pulse signal are indicated by $n1 \times T_{CLK2}$, $n2 \times T_{CLK2}$, $n3 \times T_{CLK2}$, and $N_H \times T_{CLK2}$, respectively. A waveform of a voltage formed by the one-shot multivibrator 2 and the voltage converting circuit 3 based on this pulse signal is indicated in FIG. 6F.

On the other hand, when the value of the time period data becomes small and then is smaller than $N_H$, the level of the signal outputted from the comparator 221 is changed into the high level, so that the data of $N_H$ is outputted from the selector 223. Based on this output data of $N_H$, the pulse signal having the time period corresponding to this $N_H$ is outputted from the D type flip-flop circuit 233 and then is converted into a voltage. As a consequence, the frequency of the input pulse signal is clamped at the high clamping frequency, and then is converted into a voltage.

Similarly, when the frequency of the input pulse signal is lowered as the time elapse, this frequency is clamped at the low clamping frequency.

(THIRD EMBODIMENT)

In accordance with a third embodiment, such a voltage pattern which is varied in a stepwise manner at a plurality of frequencies is formed, which is different from the above-described second embodiment where the clamping operation is carried out by two steps, i.e., high clamping frequency and low clamping frequency.

Figure 7:
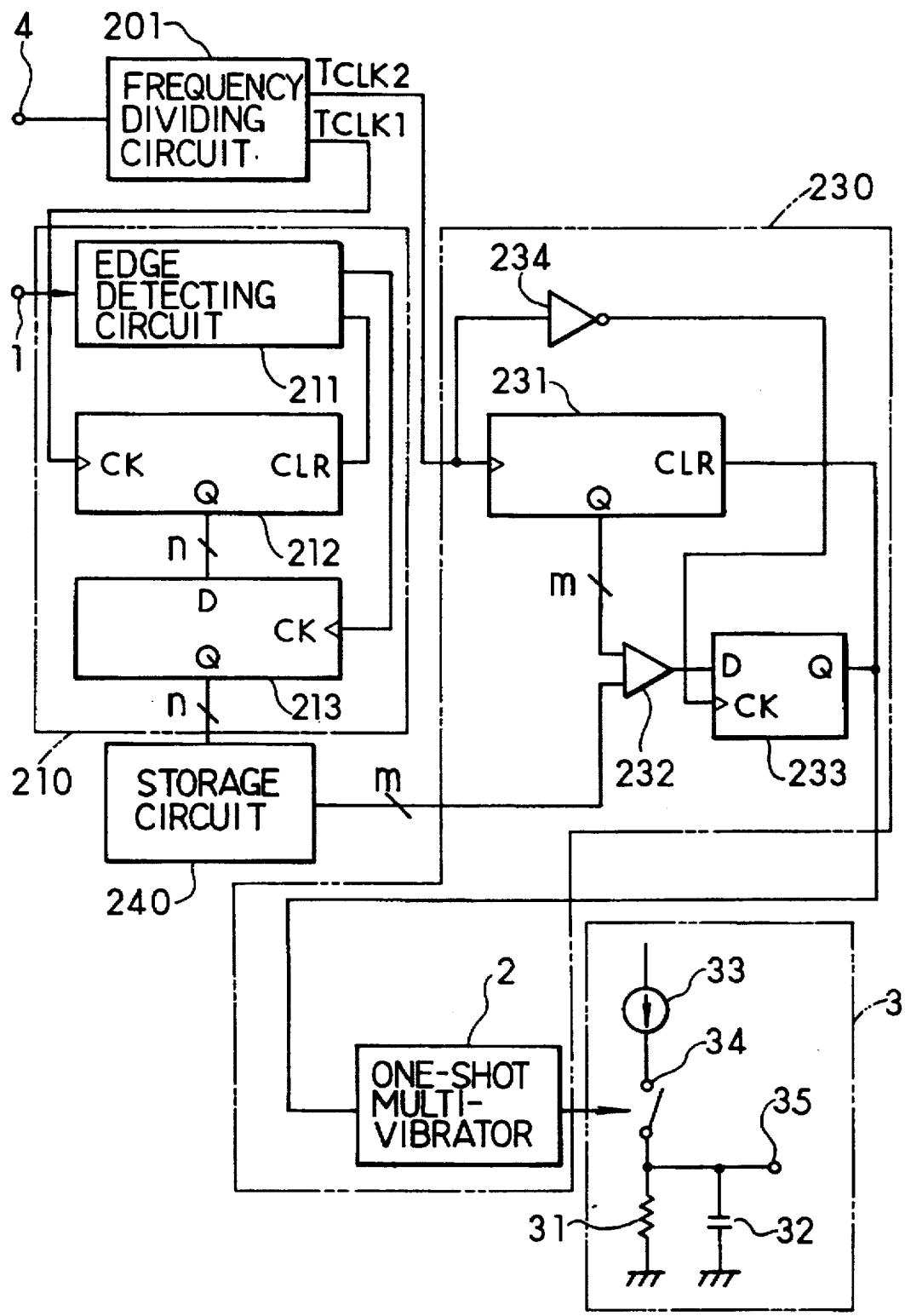
FIG. 7 is a schematic circuit arrangement of another frequency/voltage converting apparatus according to a third embodiment of the present invention.

A concrete circuit arrangement of this third embodiment is shown in FIG. 7.

The circuit arrangement of the third embodiment shown in FIG. 7 has such a different point from the circuit arrangement indicated in FIG. 5, namely the time period setting circuit 220 of FIG. 5 is substituted by a storage circuit 240 constructed of a ROM, and includes other circuits similar to those of FIG. 5.

Figures 8, 9:
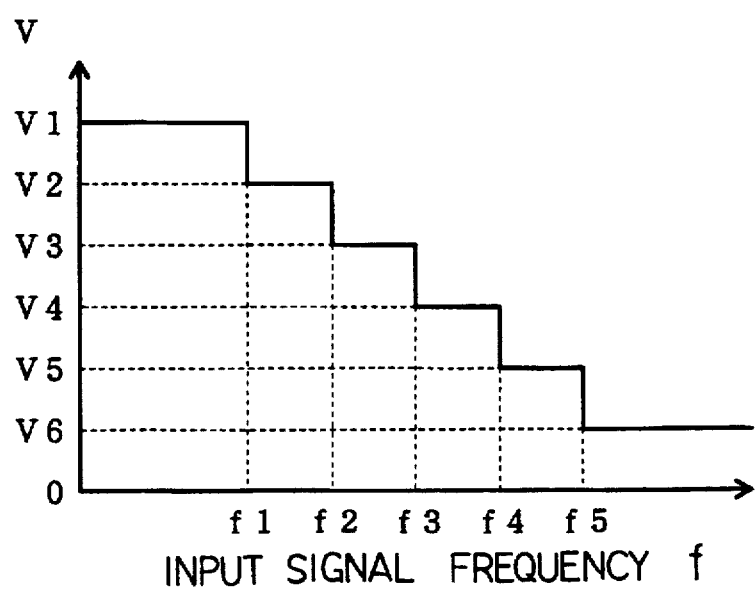
FIG. 8 schematically indicates contents of a table stored in a storage circuit of FIG. 7.
FIG. 9 is a characteristic diagram for representing a relationship between an input signal frequency and an output voltage.

As represented in FIG. 8, output time period data changed in a stepwise manner are stored as a memory table in this ROM in correspondence with the time period data outputted from the counting circuit 210. More specifically, preselected time period data are outputted for each of predetermined time period data ranges in such a manner that the output time period data is selected to "d1" while the time period data are from 0 to a1; the output time period data is selected to be "d2" while the time period data are from a1 to a2; the output time period data is selected to be "d3" while the time period data is from a2 to a3; and the output time period data is selected to be "d4" while the time period data are from a3 to a4, . . . . As a consequence, the pulse signal having the time period in proportional to the output time period data of the ROM is generated from the pulse signal generating circuit 230. As a result, this pulse signal is converted into such a voltage that is varied in a stepwise manner as illustrated in FIG. 9 with respect to the input signal frequency.

It should be noted that such a rewritable memory as an EPROM is employed as this storage circuit 240, and data to be stored into this EPROM are changed, so that a desirable F-V converting characteristic may be obtained. In this case, when an electrically erasable memory, i.e., an EEPROM is employed, more easy data rewriting may be achieved.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A frequency-to-voltage converting apparatus comprising:

clock signal generating means for outputting a clock signal having a clamping frequency;

frequency judging means, connected to said clock signal generating means to receive said clock signal, for generating a judgment signal representative of whether or not a frequency of an input pulse signal applied to said frequency judging means reaches said clamping frequency;

voltage converting means for generating, responsive to a control signal applied thereto, a converted output signal having a voltage representative of a frequency of a conversion signal applied thereto; and control means connected to said frequency judging means to receive said judgment signal for, when said judgment signal indicates that said frequency of said input pulse signal is less than said clamping frequency, generating said control signal to cause said voltage converting means to generate said converted output signal having a voltage representative of said frequency of said input pulse signal, and for, when said judgment signal indicates that said frequency of said input pulse signal reaches said clamping frequency, generating said control signal to cause said voltage converting means to generate said converted output signal having a voltage representative of said clamping frequency of said clock signal.

2. A frequency-to-voltage converting apparatus comprising:

counting means for counting each time period of an input pulse signal applied thereto and for generating a count signal representative thereof;

clock signal generating means for generating a clock signal having a set time period corresponding to a clamping frequency;

comparing means connected to said counting means for receiving said count signal and comparing said time period of said input pulse signal counted by said counting means with said set time period, every time period of said input pulse signal, and outputting a comparison result;

selecting/outputting means connected to said clock signal generating means and said comparing means to respectively receive said clock signal and said comparison result for receiving said input pulse signal and selecting, based on said comparison result of said comparing means, one of said input pulse signal and said clock signal, and outputting said selected signal; and voltage converting means for generating a converted output signal having a voltage corresponding to a frequency of said pulse signal output from said selecting/outputting means.

3. A frequency-to-voltage converting apparatus as claimed in claim 2, wherein said selecting/outputting means comprises:

selecting means for receiving said input pulse signal and said clock signal and for selecting as an output one of said input pulse signal and said clock signal; and constant-width pulse signal generating means connected to said selecting means to receive said output thereof for generating a constant-width pulse signal having a constant width triggered by an edge of said output from said select means.

4. A frequency-to-voltage converting apparatus as claimed in claim 3, wherein said voltage converting means comprises:

switching means, connected to said constant-width pulse signal generating means and operable in response to said constant-width pulse signal for supplying a constant current from a constant current source to a time constant circuit including
   a resistor, and
   a capacitor connected in parallel with said resistor.

5. A frequency-to-voltage converting apparatus as claimed in claim 2, further comprising:

clock generating means connected to said counting means, for generating a clock having a predetermined frequency;

wherein said counting means is for receiving said clock and for performing said counting operation based on said clock; and said clock signal generating means a frequency-divider connected to said clock generating means to generate said clock signal by frequency-dividing said clock.

6. A frequency-to-voltage converting apparatus as claimed in claim 3, further comprising:

clock generating means, connected to said counting means, for generating a clock having a predetermined frequency;

wherein said counting means is for receiving said clock and for performing said counting operation based on said clock; and said clock signal generating means includes a frequency-divider to generate said clock signal by frequency-dividing said clock.

7. A frequency-to-voltage converting apparatus as claimed in claim 4, further comprising:

clock generating means, connected to said counting means, for generating a clock having a predetermined frequency;

wherein said counting means is for receiving said clock and for performing said counting operation based on said clock; and said clock signal generating means includes a frequency-divider to generate said clock signal by frequency-dividing said clock.

8. A frequency-to-voltage converting apparatus comprising:

edge detecting means for detecting an edge of an input pulse signal applied thereto and outputting an edge detection signal representative thereof;

counting means for counting a time period of said input pulse signal using said edge detection signal output from said edge detecting means and for generating data indicative of said time period;

setting data outputting means for outputting clamping frequency data corresponding to a set time period of a predetermined clamping frequency;

comparing means, connected to said counting means to receive said count data and to said setting data outputting means to receive said clamping frequency data, for comparing data indicative of said time period of said input pulse signal with said clamping frequency data, to produce a comparison result;

clock signal generating means for generating a clock signal having said set time period;

selecting/outputting means connected to said comparing means to receive said comparison result and to said clock signal generating means to receive said clock signal, for receiving said input pulse signal and for selecting, based on said comparison result of said comparing means, one of said input pulse signal and said clock signal, and outputting an output pulse signal representative thereof; and voltage converting means connected to said selecting/outputting means for generating a converted output signal having a voltage corresponding to a frequency of said pulse signal output from said selecting/outputting means.

9. A frequency-to-voltage converting apparatus as claimed in claim 8, wherein said selecting/outputting means comprises:

select means for receiving said input pulse signal and said clock signal and for selecting as an output one of said input pulse signal and said clock signal; and constant-width pulse signal generating means connected to said select means to receive said output thereof for generating a constant-width pulse signal having a constant width triggered by an edge of said output from said select means.

10. A frequency-to-voltage converting apparatus as claimed in claim 9, wherein said voltage converting means comprises:

switching means, connected to said constant-width pulse signal generating means and operable in response to said constant-width pulse signal for supplying a constant current from a constant current source to a time constant circuit including a resistor, and a capacitor connected in parallel with said resistor.

11. A frequency-to-voltage converting apparatus as claimed in claim 8, further comprising:

clock generating means connected to said counting means, for generating a clock having a predetermined frequency;

wherein said counting means is for receiving said clock and for performing said counting operation based on said clock; and said clock signal generating means includes a frequency-divider to generate said clock signal by frequency-dividing said clock.

12. A frequency-to-voltage converting apparatus as claimed in claim 9, further comprising:

clock generating means, connected to said counting means, for generating a clock having a predetermined frequency;

wherein said counting means is for performing said counting operation based on said clock; and said clock signal generating means includes a frequency-divider to generate said clock signal by frequency-dividing said clock.

13. A frequency-to-voltage converting apparatus as claimed in claim 10, further comprising:

clock generating means, connected to said counting means for generating a clock having a predetermined frequency;

wherein said counting means is for receiving said clock and for performing said counting operation based on said clock; and said clock signal generating means includes a frequency-divider to generate said clock signal by frequency-dividing said clock.

14. A frequency-to-voltage converting apparatus comprising:

time period measuring means for measuring a time period of an input pulse signal applied thereto and outputting time period data representative of said time period;

time period data converting means connected to said time period measuring means to receive said time period data for converting said time period data to clamped data indicative of a predetermined clamping frequency;

pulse signal generating means connected to said time period data converting means to receive said clamped data for generating an output pulse signal having a time period and a constant pulse width corresponding to said clamped data; and voltage converting means connected to said pulse signal generating means for outputting a converted output signal having a voltage proportional to a duty ratio of said output pulse signal.

15. A frequency-to-voltage converting apparatus as claimed in claim 14, wherein said time period data converting means comprises clamping means connected to said time period data converting means to receive said time period data for clamping said time period data based on clamping frequency data.

16. A frequency-to-voltage converting apparatus as claimed in claim 14, wherein said time period data converting means comprises storage means connected to said time period data converting means to receive said time period data for converting said time period data based on stored conversion data.

17. A frequency-to-voltage converting apparatus as claimed in claim 16, wherein:

said conversion data stored in said storage means is such that said voltage converting means converts said pulse signal in a stepwise manner.

18. A frequency-to-voltage converting apparatus comprising:

edge detecting means for detecting an edge of an input pulse signal applied thereto and outputting an edge detection signal representative of said edge;

counting means, connected to said edge detecting means to receive said edge detection signal, for counting a number of clock signals between successive edge detection signals corresponding to a time period of said input pulse signal;

setting data outputting means for outputting clamping frequency data corresponding to a set time period corresponding to a clamping frequency;

comparing means, connected to said counting means to receive said count of said number of clock signals and said setting data outputting means to receive said clamping frequency data, for comparing data indicative of said time period of said input pulse signal with said clamping frequency data, to produce a comparison result;

clock signal generating means for generating a clock signal having said set time period;

selecting/outputting means, connected to said edge detecting means, said comparing means and said clock signal generating means, and to which said edge detection signal from said edge detection means and said clock signal from said clock signal generating means are input as input signals, and to which said comparison result from said comparing means is input as a selection signal, for selecting, based on said comparison result, one of said clock signal and said input pulse signal as an output pulse signal; and voltage converting means, connected to said selecting/outputting means to receive said output pulse signal, for generating a converted output signal having a voltage indicative of a frequency of said pulse signal.

19. A frequency-to-voltage conversion apparatus according to claim 18, wherein:

said edge detecting means is for detecting a rising edge of said input pulse signal.

20. A frequency-to-voltage conversion apparatus comprising:

edge detecting means for detecting an edge of an input pulse signal a thereto and outputting an edge detection signal representative of said edge;

counting means, connected to said edge detecting means to receive said edge detection signal, for counting a number of clock signals between successive edge detection signals corresponding to a time period of said input pulse signal and outputting time period data representative thereof;

period data converting means, connected to said counting means to receive said time period data, for converting said time period data to converted time period data;

pulse signal generating means, connected to said period data converting means to receive said converted time period data, for generating an output pulse signal having a time period and constant pulse width corresponding to said converted time period data; and voltage converting means, connected to said pulse signal generating means to receive said output pulse signal, for outputting a signal having a voltage which is proportional to a duty factor of said output pulse signal.

21. A frequency-to-voltage conversion apparatus according to claim 20, wherein:

said edge detecting means is for detecting a rising edge of said input pulse signal.

22. A frequency-to-voltage converting apparatus comprising:

a clock signal generator to output a clock signal having a clamping frequency;

a comparator to generate a comparison signal representative of whether or not a frequency of an input pulse signal applied thereto reaches said clamping frequency;

a frequency-to-voltage converter to generate an output signal having a voltage corresponding to a frequency of an input conversion signal thereto; and a switch, connected to said clock signal generator to receive said clock signal and controlled by said comparison signal, to receive said input pulse signal and provide as said input conversion signal, said input pulse signal when said frequency of said input pulse signal is less than said clamping frequency, and said clock signal when said frequency of said input pulse signal is greater than said clamping frequency.

23. A frequency-to-voltage converting apparatus according to claim 22, wherein:

said clamping frequency is a frequency below which said input signal is clamped.

24. A frequency-to-voltage converting apparatus comprising:

a counter to count each time period of an input pulse signal applied thereto as count data;

a clock signal generator to generate a clock signal having a set time period corresponding to a clamping frequency;

a comparator connected to said counter to receive said count data and to compare said time period of said input pulse signal counted by said counter as represented by said count data with said set time period, every time period of said input pulse signal, and to output a comparison result indicative thereof;

a switch, connected to said comparator to receive said comparison result and to said clock signal generator to receive said clock signal, to receive said input pulse signal and select, based on said comparison result of said comparator, one of said input pulse signal and said clock signal as an output pulse signal; and a frequency-to-voltage converter to generate a converted output signal having a voltage representative of a frequency of said pulse signal.

25. A frequency-to-voltage converting apparatus according to claim 24, wherein:

said frequency is a frequency below which said input signal is clamped.

26. A frequency-to-voltage converting apparatus comprising:

an edge detector to detect an edge of an input pulse signal applied thereto and output an edge detection signal representative thereof;

a counter connected to said edge detector to receive said edge detection signal to count a time period of said input pulse signal using said edge detection signal;

a memory to output clamping frequency data indicative of said time period of a predetermined clamping frequency;

a comparator connected to said counter to receive said counted input pulse signal time period and to said memory to receive said clamping frequency data indicative of said time period of a predetermined clamping frequency to compare said data indicative of said time period of said input pulse signal with said clamping frequency data, to produce a comparison result;

a clock generator to generate a clock signal having said set time period;

a switch connected to said clock generator to receive said clock signal and to said comparator to receive said comparison result to receive said input pulse signal and select, based on said comparison result of said comparator, one of said input pulse signal and said clock signal as an output pulse signal; and a frequency-to-voltage converter connected to said switch to receive said output pulse signal and to generate a converted output signal having a voltage corresponding to a frequency of said output pulse signal.

27. A frequency-to-voltage converting apparatus according to claim 26, wherein:

said clamping frequency is a frequency below which said input signal is clamped.

* * * * *